United States Patent
Shindo

(10) Patent No.: US 12,469,724 B2
(45) Date of Patent: Nov. 11, 2025

(54) CORRECTION METHOD AND SUBSTRATE TRANSFER APPARATUS

(71) Applicant: Tokyo Electron Limited, Tokyo (JP)

(72) Inventor: Takehiro Shindo, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 235 days.

(21) Appl. No.: 17/536,467

(22) Filed: Nov. 29, 2021

(65) Prior Publication Data

US 2022/0181178 A1 Jun. 9, 2022

(30) Foreign Application Priority Data

Dec. 3, 2020 (JP) ................... 2020-200793

(51) Int. Cl.
*H01L 21/67* (2006.01)

(52) U.S. Cl.
CPC .............................. *H01L 21/67259* (2013.01)

(58) Field of Classification Search
CPC ................................................ H01L 21/67259
See application file for complete search history.

(56) References Cited

U.S. PATENT DOCUMENTS

| | | | | |
|---|---|---|---|---|
| 6,099,596 A * | 8/2000 | Li | .................... | H01L 21/67259 29/25.01 |
| 6,244,121 B1 * | 6/2001 | Hunter | .................. | H01L 21/681 73/866.5 |
| 6,895,831 B2 * | 5/2005 | Hunter | .............. | H01L 21/67167 414/148 |
| 7,283,255 B2 * | 10/2007 | Ramsey | ............ | H01L 21/67259 356/614 |
| 2003/0223057 A1 * | 12/2003 | Ramsey | ............ | H01L 21/67259 356/138 |
| 2006/0171561 A1 * | 8/2006 | Ramsey | ............ | H01L 21/67259 356/3 |
| 2006/0236793 A1 | 10/2006 | Hunter | | |
| 2022/0254666 A1 * | 8/2022 | Sadeghi | ............ | H01L 21/68742 |

FOREIGN PATENT DOCUMENTS

| | | |
|---|---|---|
| JP | 2000-127069 A | 5/2000 |
| JP | 2007242967 A | 9/2007 |

\* cited by examiner

*Primary Examiner* — Gerald McClain
(74) *Attorney, Agent, or Firm* — Nath, Goldberg & Meyer; Jerald L. Meyer; Tanya E. Harkins

(57) ABSTRACT

A correction method includes a placement operation of holding and moving, by a holder, a sensor-equipped substrate equipped with an inclination sensor provided thereon, to a temporary delivery position, and delivering the sensor-equipped substrate from the holder to the stage, an inclination detection operation of detecting, by the inclination sensor, an inclination of the sensor-equipped substrate delivered to the stage, and performing the placement operation and the inclination detection operation on one or a plurality of different temporary delivery positions. The one or plurality of different temporary delivery positions include a position at which a portion of the sensor-equipped substrate is boarded on the stepped portion when the sensor-equipped substrate is delivered from a respective temporary delivery position to the stage. The method further includes a correction operation of correcting the delivery position based on a detection result in the inclination detection operation.

5 Claims, 6 Drawing Sheets

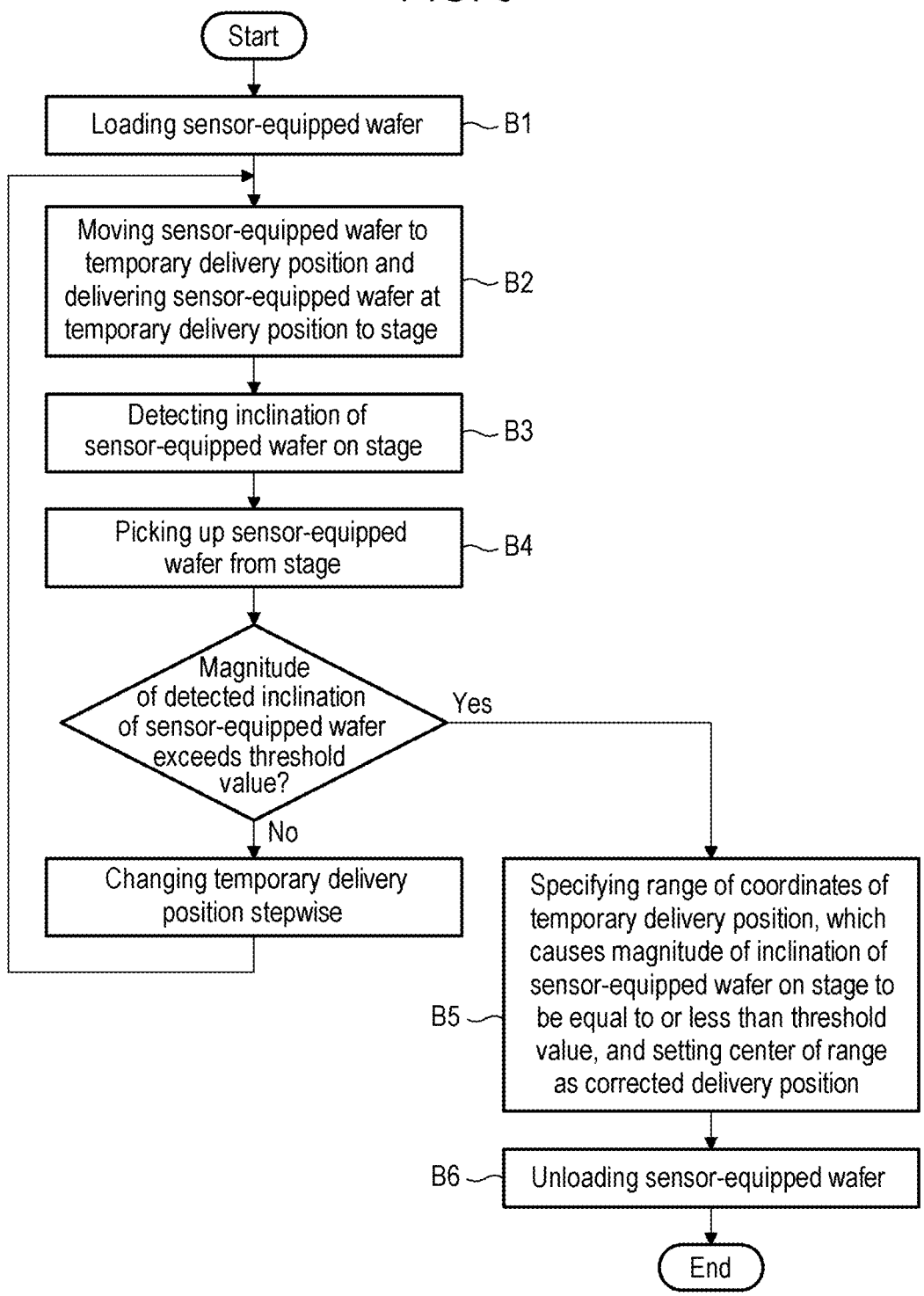

CORRECTION METHOD AND SUBSTRATE TRANSFER APPARATUS

CROSS-REFERENCE TO RELATED APPLICATION

This application is based upon and claims the benefit of priority from Japanese Patent Application No. 2020-200793, filed on Dec. 3, 2020, the entire contents of which are incorporated herein by reference.

TECHNICAL FIELD

The present disclosure relates to a correction method and a substrate transfer apparatus.

BACKGROUND

Patent Document 1 discloses a method of aligning a transfer arm part having a fork that holds a wafer with respect to a teaching reference position corresponding to a susceptor of a processing chamber. In this method, the wafer is first accurately aligned and placed on the susceptor of the processing chamber in a manual manner. Then, the wafer is delivered to the transfer arm part, a load-lock chamber, and a transfer arm part that transfers the wafer in a cassette container in the named order, and is transferred to an orienter in which an eccentricity amount and an eccentric direction of the wafer are calculated to obtain an appropriate position coordinate relative to the teaching reference position.

PRIOR ART DOCUMENT

Patent Document

Patent Document 1: Japanese Laid-Open Patent Publication No. 2000-127069

SUMMARY

According to one embodiment of the present disclosure, there is provided a method of correcting a delivery position of a substrate from a substrate transfer apparatus to a processing apparatus that processes the substrate in a depressurized atmosphere, wherein the substrate transfer apparatus includes a holder configured to hold the substrate, and the processing apparatus includes a stage including a placement surface on which the substrate is placed and an annular stepped portion concentric with the placement surface, the annular stepped portion being provided to surround a peripheral edge of the placement surface and to protrude upward, wherein the method includes: a placement operation of holding and moving, by the holder, a sensor-equipped substrate, which includes an inclination sensor provided on a substrate main body that imitates the substrate, to a temporary delivery position, and delivering the sensor-equipped substrate from the holder to the stage to be placed on the stage; an inclination detection operation of detecting, by the inclination sensor, an inclination of the sensor-equipped substrate delivered to the stage; and performing the placement operation and the inclination detection operation on one temporary delivery position or a plurality of different temporary delivery positions, wherein the one temporary delivery position or the plurality of different temporary delivery positions include a position at which a portion of the sensor-equipped substrate is boarded on the stepped portion when the sensor-equipped substrate is delivered from a respective temporary delivery position to the stage, the method further includes: a correction operation of correcting the delivery position based on a detection result in the inclination detection operation.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 9 is a flowchart for describing an example of a method of correcting the delivery position.

DETAILED DESCRIPTION

Figure 1:
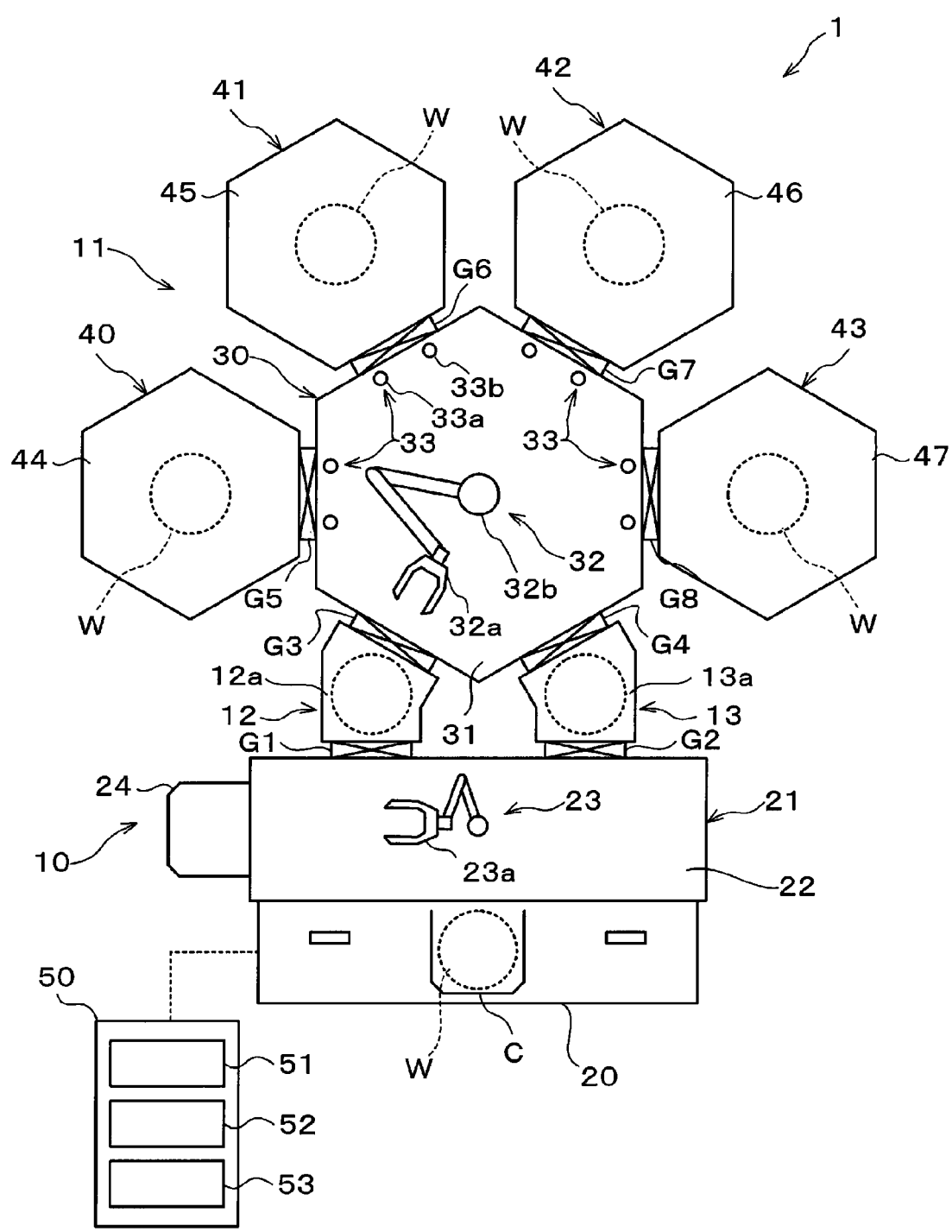
FIG. 1 is a plan view schematically illustrating a configuration of a wafer processing system including a vacuum transfer apparatus as a substrate transfer apparatus according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

For example, in a process of manufacturing a semiconductor device or the like, a process, such as a film forming process, an etching process or the like, is performed on a substrate such as a semiconductor wafer (hereinafter, referred to as a "wafer") in a depressurized atmosphere. The above-mentioned process is performed by a processing apparatus including a stage on which the substrate is placed. A substrate transfer apparatus provided with a holder configured to hold the substrate is used when the substrate is loaded into and unloaded from the processing apparatus.

In order to obtain an appropriate processing result, such as a uniform processing result in the plane of the wafer as a processing result by the processing apparatus, it is necessary to accurately align and place the substrate on the stage. Therefore, there have been proposed various techniques for correcting a delivery position of the substrate from a substrate transfer apparatus to a processing apparatus to accurately align and place the substrate as described above. However, in the correction method involving a manual operation of the processing apparatus, that is, operation by an operator, as disclosed in Patent Document 1, the processing apparatus is first required to be exposed to the atmosphere. In addition, in order to resume the process in the processing apparatus, evacuation time is required. As such, there is room for improvement in terms of time required for correction.

Therefore, the technique according to the present disclosure corrects a delivery position of a substrate from a substrate transfer apparatus to a processing apparatus that processes a substrate in a depressurized atmosphere in a short period of time.

Hereinafter, a correction method and a substrate transfer apparatus according to the present embodiment will be described with reference to the drawings. In the specification and drawings, elements having substantially the same functional configurations will be denoted by the same reference numerals and redundant descriptions thereof will be omitted.

<Wafer Processing System>

Figure 2:
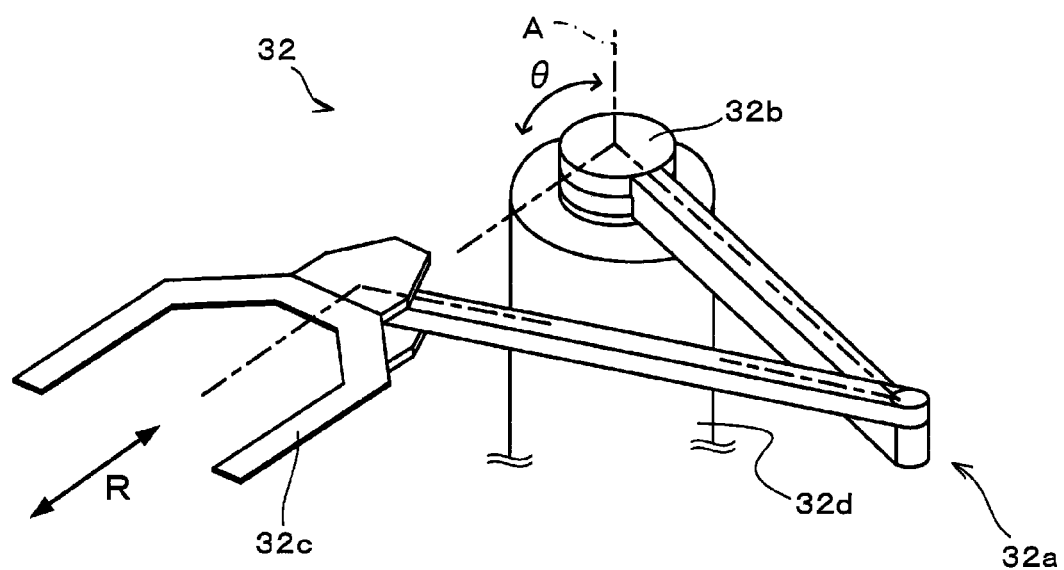
FIG. 2 is a perspective view schematically illustrating a configuration of a transfer arm.
Figure 3:
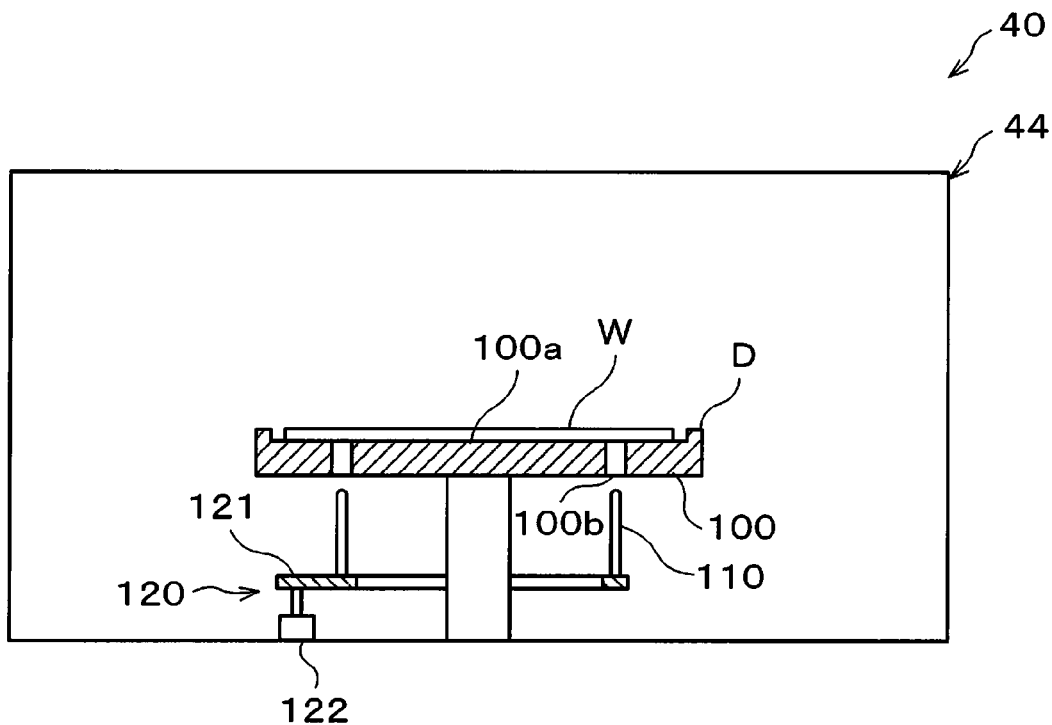
FIG. 3 is a view schematically illustrating only a portion of an internal configuration inside a vacuum processing chamber.

FIG. 1 is a plan view schematically illustrating a configuration of a wafer processing system including a vacuum transfer apparatus as a substrate transfer apparatus according to an embodiment. FIG. 2 is a perspective view schematically illustrating a configuration of a transfer arm. FIG. 3 is a view schematically illustrating only a portion an internal configuration of a vacuum processing chamber to be described later.

A wafer processing system 1 illustrated in FIG. 1 performs a predetermined process, such as a film forming process, a diffusion process, an etching process or the like on a wafer W as a substrate under a reduced pressure. The wafer processing system 1 has a configuration in which a carrier station 10 into and from which a carrier C capable of accommodating a plurality of wafers W and a sensor-equipped wafer (to be described later) is loaded and unloaded, and a processing station 11 including a plurality of various processing apparatuses in each of which the predetermined process is performed on the wafer W under a reduced pressure are connected integrally with each other. The carrier station 10 and the processing station 11 are connected via two load-lock apparatuses 12 and 13.

The load-lock apparatuses 12 and 13 include respective load-lock chambers 12a and 13a configured to switch the interiors thereof between an atmospheric pressure state and a vacuum state, respectively. The load-lock apparatuses 12 and 13 are provided so as to connect an atmospheric transfer apparatus 21 and a vacuum transfer apparatus 30, which will be described later.

The carrier station 10 includes a carrier stage 20 and an atmospheric transfer apparatus 21 provided adjacent to the carrier stage 20.

The carrier stage 20 is configured so that a plurality of (e.g., three) carriers C may be placed side by side. The atmospheric transfer apparatus 21 includes an atmospheric transfer chamber 22 whose interior is under atmospheric pressure. The atmospheric transfer chamber 22 is connected to the load-lock chambers 12a and 13a of the load-lock apparatuses 12 and 13 via gate valves G1 and G2. A wafer transfer mechanism 23 is provided inside the atmospheric transfer chamber 22. The wafer transfer mechanism 23 is configured to transfer the wafer W between the carrier C on the carrier stage 20 and the load-lock chambers 12a and 13a under the atmospheric pressure.

The carrier station 10 further includes an aligner 24 provided adjacent to the atmospheric transfer apparatus 21. The aligner 24 recognizes a notch or the like formed in the wafer W to adjust an orientation of the wafer W.

The processing station 11 includes a vacuum transfer apparatus 30 as a substrate transfer apparatus and processing apparatuses 40 to 43.

The vacuum transfer apparatus 30 has a vacuum transfer chamber 31 whose interior is maintained in a depressurized state (a vacuum state). The vacuum transfer chamber 31 includes a housing that is configured to be sealable, and is formed to have, for example, a substantially polygonal shape (a hexagonal shape in the illustrated example) in a plan view. The vacuum transfer chamber 31 is connected to the load-lock chambers 12a and 13a of the load-lock apparatuses 12 and 13 via gate valves G3 and G4. In addition, the vacuum transfer chamber 31 is connected to vacuum chambers 44 to 47 to be described later via respective gate valves G5 to G8. The vacuum transfer chamber 31 includes a wafer transfer mechanism 32 as a substrate transfer mechanism configured to transfer the wafer W with respect to the vacuum processing chambers 44 to 47 (to be described later) of the processing apparatuses 40 to 43.

The wafer transfer mechanism 32 includes a transfer arm 32a and a base 32b. The wafer transfer mechanism 32 may include a plurality of transfer arms. The transfer arm 32a is constituted with an articulated arm. The base 32b pivotally supports the root portion of the transfer arm 32a. The wafer transfer mechanism 32 is configured to transfer the wafer W while holding the wafer by the transfer arm 32a.

As illustrated in FIG. 2, the transfer arm 32a is provided with a transfer pick 32c at the tip end thereof. In addition, the base 32b is provided with a drive mechanism 32d that generates a driving force for moving the transfer pick 32c. The drive mechanism 32d includes an actuator such as a motor. Using the driving force generated by the drive mechanism 32d, the transfer arm 32a is rotatable about a central axis A of the base 32b, and the transfer pick 32c is movable in the circumferential direction (θ direction in the figure) centered at the central axis A. In addition, the transfer arm 32a is extendible by the driving force generated by the drive mechanism 32d so that the transfer pick 32c is movable in the radial direction (R direction in the figure) centered at the central axis A of the base 32b.

In addition, as illustrated in FIG. 1, position detection mechanisms 33 configured to detect a position of the wafer W held by the transfer pick 32c of the transfer arm 32a of the wafer transfer mechanism 32 are provided inside the vacuum transfer chamber 31. Based on the detection results obtained by the position detection mechanisms 33, the controller 51, which will be described later, calculates a positional deviation (from a reference position) of the wafer W on the transfer pick 32c.

The position detection mechanisms 33 is provided for, for example, each of the processing apparatuses 40 to 43. Specifically, the position detection mechanisms 33 are provided, for example, on a transfer path of the wafer W to the processing apparatus 40 in the vicinity of the gate valve G5, on a transfer path of the wafer W to the processing apparatus 41 in the vicinity of the gate valve G6, on a transfer path of the wafer W to the processing apparatus 42 in the vicinity of the gate valve G7, and on a transfer path of the wafer W to the processing apparatus 43 in the vicinity of the gate valve G8, respectively.

Each of the position detection mechanism 33s includes, for example, a pair of photoelectric sensors 33a and 33b arranged along, for example, the respective gate valve (any of the gate valves G5 to G8). The photoelectric sensors 33a and 33b are of, for example, a transmissive type, and each include a light-emitting part (not illustrated) and a light-receiving part (not illustrated), which are provided on the ceiling side and the floor side, respectively, inside the vacuum transfer chamber 31, wherein each photoelectric sensor is configured such that light from the light-emitting part is received by the light-receiving part. While the wafer passes through a space between the light-emitting part and the light-receiving part, the reception of light by the light-receiving part is halted, and when the wafer W passes through the space between the light-emitting part and the light-receiving part, the reception of light by the light-receiving part is resumed. A length of a light reception halt period in the photoelectric sensors 33a and 33b varies depending on the position of the wafer W on the transfer pick 32c. Therefore, the controller, which will be described later, calculates the positional deviation (from the reference position) of the wafer W on the transfer pick 32c based on the length of the light reception halt period in the photoelectric sensors 33a and 33b. The method of calculating the positional deviation of the wafer W (from the reference position) on the transfer pick 32c is not limited to the above method, and other known methods may be used.

Each of the processing apparatuses 40 to 43 performs a predetermined process, such as a film forming process, a diffusion process, an etching process or the like on the wafer W under a reduced pressure. The processing apparatuses 40 to 43 include respective vacuum processing chambers 44 to 47 whose interior is depressurized to perform the predetermined process the wafer W. In addition, an apparatus that performs a process adapted for the purpose of processing the wafer may be arbitrarily selected from the processing apparatuses 40 to 43.

As illustrated in FIG. 3, a stage 100 is provided within the vacuum processing chamber 44 of the processing apparatus 40. An upper surface of the central portion of the stage 100 forms a placement surface 100a on which the wafer is placed. In addition, an upper surface of the peripheral portion of the stage 100 is formed to be higher than the upper surface of the central portion. That is, the stage 100 has an annular stepped portion D concentric with the placement surface 100a, which is provided to surround the peripheral edge of the placement surface 100a and protrudes upward. A height of the stepped portion D is, for example, 1 to 3 mm. In some embodiments, in the stage 100, a member forming the placement surface 100a and a member forming the stepped portion D may be different from each other.

Under the stage 100 inside the vacuum processing chamber 44, a plurality of (e.g., three) support pins 110 are provided to extend in the vertical direction. These support pins 110 are connected to a lifting mechanism 120 that moves the support pins 110 upward and downward. The lifting mechanism 120 includes, for example, a support member 121 configured to support the plurality of support pins 110, and a drive part 122 configured to generate a driving force for raising and lowering the support member 121 to move the plurality of support pins 110 upward and downward. The drive part 122 includes an actuator (not illustrated) such as a motor that generates the driving force. The support pins 110 moves upward and downward with respect to the placement surface 100a of the stage 100 by moving upward and downward through respective through-holes 100b formed in the stage 100 so that the wafer W is delivered between the stage 100 and the transfer pick 32c.

Similar to the vacuum processing chamber 44, each of the vacuum processing chambers 45 to 47 also includes the stage 100, the support pins 110, and the like.

As illustrated in FIG. 1, the wafer processing system 1 is provided with a control device 50. The control device 50 includes a controller 51, a communication part 52, and a storage part 53.

The controller 51 outputs a control signal for controlling a wafer processing in the wafer processing system 1 or corrects a delivery position of the wafer W from the vacuum transfer apparatus 30 to each of the processing apparatuses 40 to 43, and includes, for example, a processor such as a CPU, and storage means such as a RAM or a ROM.

The communication part 52 communicates with the sensor-equipped wafer, which will be described later. The communication part 52 receives, for example, detection results by an inclination sensor provided in the sensor-equipped wafer, from the sensor-equipped wafer. The communication between the communication part 52 and the sensor-equipped wafer is performed, for example, in a wireless manner.

The storage part 53 stores various pieces of information, and includes a hard disk drive (HDD), a RAM, a ROM, and the like. The storage part 53 stores a program that controls the drive mechanism 32d of the wafer transfer mechanism 32, the drive part 122 of the lifting mechanism 120, or the like to control the wafer processing in the wafer processing system 1. The storage part 53 stores a program for correcting the delivery position of the wafer W from the vacuum transfer apparatus 30 to each of the processing apparatuses 40 to 43. These programs may be recorded in a non-transitory computer-readable storage medium and may be installed on the control device 50 from the storage medium.

<Wafer Processing>

Figure 8:
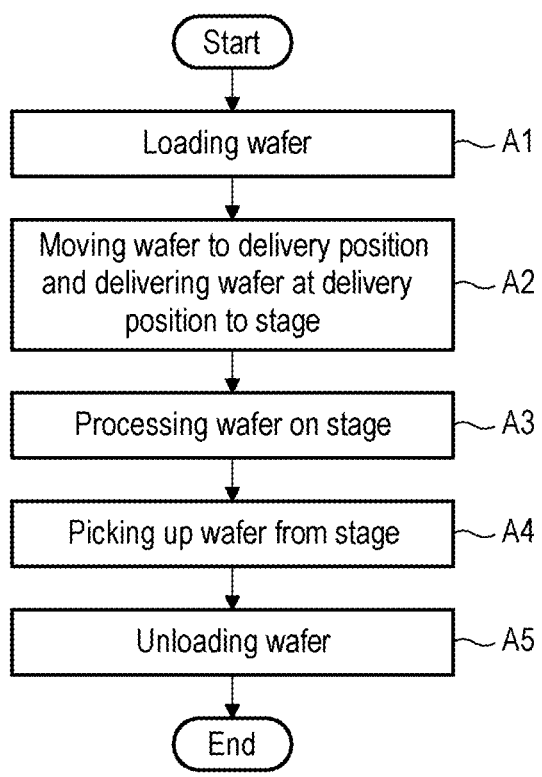
FIG. 8 is a flowchart for describing an example of wafer processing performed by the wafer processing system.

Next, an example of the wafer processing performed by using the wafer processing system 1 configured as described above will be described with reference to FIG. 8. The following process is performed under the control of the controller 51.

(A1: Loading of Wafer W into Vacuum Transfer Apparatus 30)

First, the wafer W is loaded into the vacuum transfer apparatus 30. Specifically, first, for example, the wafer W is removed from the carrier C by the transfer arm 23a of the wafer transfer mechanism 23 and loaded into the aligner 24. Subsequently, the orientation of the wafer W is adjusted in the aligner 24. Subsequently, the wafer W is removed from the aligner 24 by the transfer arm 23a, and the gate valve G1 is opened. Thereafter, the wafer W is loaded into the load-lock apparatus 12 by the transfer arm 23a and delivered to a support part (not illustrated) inside the load-lock apparatus 12.

Subsequently, the transfer arm 23a is withdrawn from the load-lock apparatus 12, the gate valve G1 is closed, and the interior of the load-lock apparatus 12 is sealed and depressurized.

When an internal pressure of the load-lock apparatus 12 becomes equal to or lower than a predetermined pressure, the gate valve G3 is opened, and the wafer W is picked up by the transfer pick 32c of the transfer arm 32a from the support part (not illustrated) inside the load-lock apparatus 12 and is removed from the load-lock apparatus 12. Thereafter, the gate valve G3 is closed.

(A2: Delivery to Stage 100)

Subsequently, the wafer W is delivered to, for example, the stage 100 of the processing apparatus 40. Specifically, for example, the gate valve G5 is opened, then the transfer pick 32c of the vacuum transfer apparatus 30 is moved to the delivery position relating to the processing apparatus 40, and the wafer W is loaded into the vacuum processing chamber 44 of the processing apparatus 40. More specifically, when the transfer pick 32c is moved, the wafer W passes through the position detection mechanism 33 corresponding to the processing apparatus 40. Thus, the controller 51 calculates the positional deviation (from the reference position) of the wafer W on the transfer pick 32c based on the detection results by the position detection mechanism 33. Then, the controller 51 corrects the delivery position relating to the processing apparatus 40 based on the calculated positional deviation. The transfer pick 32c is moved to the delivery position corrected based on the calculated positional deviation, and the wafer W is loaded into the vacuum processing chamber 44 of the processing apparatus 40. After the loading, the support pins 110 of the processing apparatus 40 are raised so that the wafer W is delivered to the support pins 110. The transfer pick 32c is withdrawn from the vacuum processing chamber 44, and the support pins 110 are lowered so that the wafer W is delivered to and placed on the stage 100 inside the vacuum processing chamber 44 of the processing apparatus 40.

(A3: Process)

Subsequently, the gate valve G5 is closed, the vacuum processing chamber 44 of the processing apparatus 40 is sealed, and then a process such as an etching process is performed on the wafer W in the processing apparatus 40.

(A4: Picking Up Wafer from Stage 100)

Thereafter, the vacuum transfer apparatus 30 picks up the wafer W from the stage 100 of the processing apparatus 40 in a procedure opposite to step A2 described above. However, the detection by the position detection mechanism 33 is omitted.

(A5: Unloading Wafer W from Vacuum Transfer Apparatus 30)

Thereafter, the wafer W picked up by the vacuum transfer apparatus 30 is returned to the carrier C in a procedure opposite to step A1 described above. However, in the course of returning the wafer W to the carrier C, the loading/unloading of the wafer W into/from the aligner 24 and the adjustment of the orientation of the wafer W in the aligner 24 are omitted. As a result, a series of wafer processes ends.

After the delivery position relating to the processing apparatus 40 is corrected by the correction method which will be described later, the corrected delivery position is used as the delivery position in steps A2 and A4.

<Correction Method>

Figure 4:
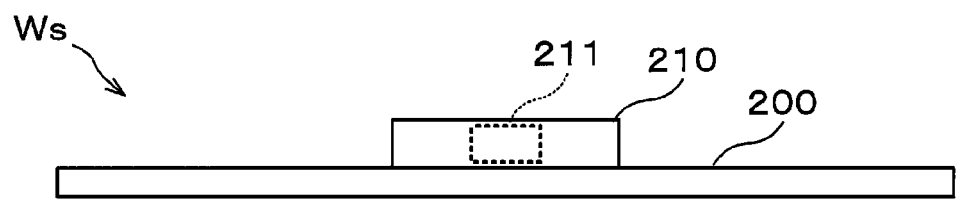
FIG. 4 is a side view for explaining a sensor-equipped wafer.
Figure 5:
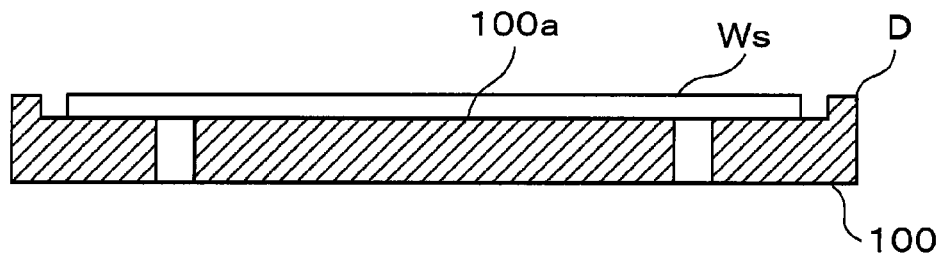
FIG. 5 is a view illustrating a state in which the sensor-equipped wafer is delivered to a stage and the entire wafer is located on a placement surface.
Figure 6:
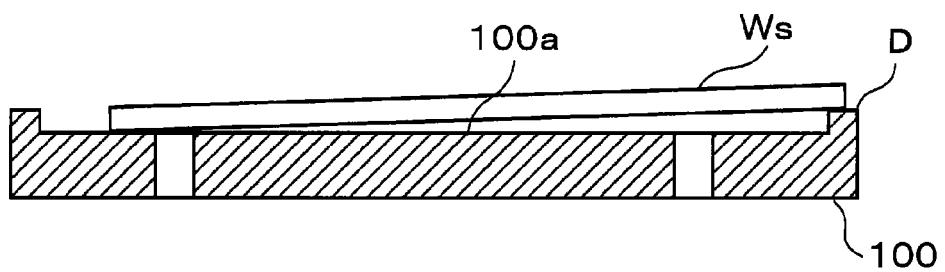
FIG. 6 is a view illustrating a state in which the sensor-equipped wafer is delivered to the stage and a portion of the wafer is boarded on a stepped portion of the stage.
Figure 7:
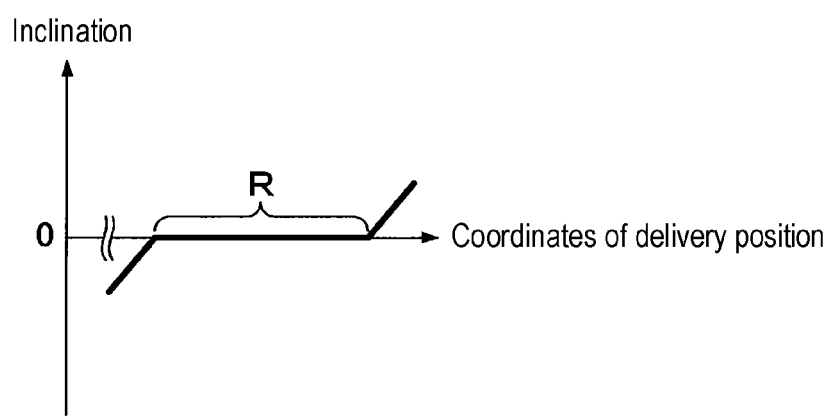
FIG. 7 is a diagram illustrating a relationship between a delivery position and an inclination of the sensor-equipped wafer delivered from the delivery position to the stage.

Next, the method of correcting the delivery position of the wafer W from the vacuum transfer apparatus 30 to each of the processing apparatuses 40 to 43 will be described with reference to FIGS. 4 to 7. Hereinafter, the method of correcting the delivery position to the processing apparatus 40 will be described, but the delivery position to each of the processing apparatuses 41 to 43 may also be corrected by the same method. FIG. 4 is a side view for explaining a sensor-equipped wafer to be described later. FIG. 5 is a view illustrating a state in which the sensor-equipped wafer is delivered to the stage 100 and is located on the placement surface 100a as a whole. FIG. 6 is a view illustrating a state in which the sensor-equipped wafer is delivered to the stage 100 and a portion of the sensor-equipped wafer is boarded on the stepped portion of the stage 100. In addition, in FIGS. 5 and 6, the illustration of a sensor unit (to be described later) is omitted. FIG. 7 is a diagram illustrating a relationship between the delivery position and the inclination of the sensor-equipped wafer delivered from the delivery position to the stage.

In the correction of the delivery position to the processing apparatus 40 according to the present embodiment, a sensor-equipped wafer Ws is used as the sensor-equipped substrate. The sensor-equipped wafer Ws has the same shape as the wafer W in a plan view, and is configured to be transferable by the wafer transfer mechanisms 23 and 32. In addition, since the sensor-equipped wafer Ws has the same shape as the wafer W in a plan view as described above, the positional deviation of the sensor-equipped wafer Ws on the transfer pick 32c may be calculated by the controller 51 based on the detection results by the position detection mechanism 33, similar to the wafer W. As illustrated in FIG. 4, the sensor-equipped wafer Ws includes a wafer main body 200 and a sensor unit 210.

The wafer main body 200 is a member that imitates the wafer W, and specifically, is a member formed in a disk shape having the same diameter (e.g., 300 mm) as that of the wafer W. In addition, the wafer main body 200 has, for example, a notch (not illustrated) formed as in the wafer W.

The sensor unit 210 includes an inclination sensor 211 configured to detect an inclination of the sensor-equipped wafer Ws with respect to a horizontal plane, and communication means (not illustrated) that communicates with the communication part 52 of the control device 50 of the wafer processing system 1. The communication means transmits the detection results and the like by the inclination sensor 211 to the communication part 52 of the control device 50, and receives a control signal by the controller 51 from the communication part 52. In addition, the sensor unit 210 includes a power supply (not illustrated) and a controller (not illustrated). The controller of the sensor unit 210 includes a processor and a storage means, executes a program stored in the storage means, and performs a control to transmit the detection results by the inclination sensor 211 to the communication part 52 of the control device 50.

In the method of correcting the delivery position relating to the processing apparatus 40 using the sensor-equipped wafer Ws configured as described above, first, under the control of the controller 51, the transfer pick 32c holding the sensor-equipped wafer Ws is moved to a temporary delivery position relating to the processing apparatus 40, and the sensor-equipped wafer Ws is delivered to the stage 100 from the transfer pork 32c and is placed on the stage 100 (in a placement operation). Subsequently, the inclination of the sensor-equipped wafer Ws placed on the stage 100 from the transfer pick 32c in the temporary delivery position is detected by the inclination sensor 211 (in an inclination detection operation).

In addition, in the delivery position correction method according to the present embodiment, the placement operation and the inclination detection operation described above are performed for a plurality of different temporary delivery positions. In the delivery position correction method according to the present embodiment, the plurality of different temporary delivery positions include the following items (a) and (b).

(a) When the sensor-equipped wafer Ws is delivered from the transfer pick 32c at the temporary delivery position to the stage 100 and is placed on the stage 100, a position at which the sensor-equipped wafer Ws is located on the placement surface 100a as a whole and is not inclined, as illustrated in FIG. 5, and (b) When the sensor-equipped wafer Ws is delivered from the transfer pick 32c at the temporary delivery position to the stage 100 and is placed on the stage 100, a position at which a portion of the sensor-equipped wafer Ws is boarded on the stepped portion D so that the sensor-equipped wafer Ws is greatly inclined, as illustrated in FIG. 6.

As a result, as illustrated in FIG. 7, a relationship between the temporary delivery position (coordinates thereof) and the inclination of the sensor-equipped wafer Ws placed on the stage 100 from the transfer pick 32c at the temporary delivery position may be obtained.

In the delivery position correction method according to the present embodiment, the controller 51 corrects the delivery position relating to the processing apparatus 40 based on the detection results for the plurality of temporary delivery positions in the inclination detection operation. Specifically, for example, based on the detection results for the plurality of temporary delivery positions in the above-described inclination detection operation, the controller 51 specifies a range of the temporary delivery positions (see reference numeral R in FIG. 7) in which a magnitude of the inclination of the sensor-equipped wafer Ws is equal to or less than a threshold value, and determines the center of the range as a corrected delivery position relating to the processing apparatus 40.

<More Specific Example of Correction Method>

Next, a more specific example of the method of correcting the delivery position relating to the processing apparatus 40 will be described with reference to FIG. 9. The correction of the delivery position relating to the processing apparatus 40 is performed, for example, when an internal component of the vacuum processing chamber 44 of the processing apparatus 40 is replaced with a new one, when a problem occurs during the transfer of the wafer W, when maintenance on the processing apparatus 40 is performed, or the like.

(B1: Loading of Sensor-Equipped Wafer Ws into Vacuum Transfer Apparatus 30)

First, under the control of the controller 51, the sensor-equipped wafer Ws is loaded into the vacuum transfer apparatus 30. Specifically, first, for example, the sensor-equipped wafer Ws is removed from the carrier C, in which the sensor-equipped wafer Ws is accommodated, on the carrier stage 20, and is loaded into the aligner 24 by the transfer arm 23a of the wafer transfer mechanism 23.

Subsequently, the orientation of the sensor-equipped wafer Ws is adjusted in the aligner 24. Specifically, in a case in which the inclination sensor 211 of the sensor-equipped wafer Ws is capable of detecting an inclination around one axis and an inclination around another axis orthogonal to the one axis, the orientation of the sensor-equipped wafer Ws is adjusted such that the X-axis and the Y-axis in the coordinate system of the delivery position relating to the processing apparatus 40 coincide with the one axis and the another axis. This adjustment is performed based on detection results of the notch (not illustrated) formed in the wafer main body 200 of the sensor-equipped wafer Ws.

Subsequently, the sensor-equipped wafer Ws is removed from the aligner 24 by the transfer arm 23a, and the gate valve G1 is opened. Thereafter, the sensor-equipped wafer Ws is loaded into the load-lock apparatus 12 by the transfer arm 23a and is delivered to the support part (not illustrated) inside the load-lock apparatus 12.

Subsequently, the transfer arm 23a is withdrawn from the load-lock apparatus 12, the gate valve G1 is closed, the interior of the load-lock apparatus 12 is sealed and depressurized.

When the internal pressure of the load-lock apparatus 12 becomes equal to or lower than a predetermined pressure, the gate valve G3 is opened, and the sensor-equipped wafer Ws is picked up by the transfer pick 32c of the transfer arm 32a from the support part (not illustrated) inside the load-lock apparatus 12 and is removed from the load-lock apparatus 12. Thereafter, the gate valve G3 is closed.

(B2: Delivery of Wafer to Stage 100)

Subsequently, under the control of the controller 51, the sensor-equipped wafer Ws is delivered to the stage 100 of the processing apparatus 40. Specifically, for example, the gate valve G5 is opened, then the transfer pick 32c of the vacuum transfer apparatus 30 is moved to the temporary delivery position relating to the processing apparatus 40, and the sensor-equipped wafer Ws is loaded into the vacuum processing chamber 44 of the processing apparatus 40. More specifically, when the transfer pick 32c is moved, the sensor-equipped wafer Ws passes through the position detection mechanism 33 corresponding to the processing apparatus 40. Thus, the controller 51 calculates the positional deviation (from the reference position) of the sensor-equipped wafer Ws on the transfer pick 32c based on the detection results by the position detection mechanism 33. Then, the controller 51 corrects the temporary delivery position relating to the processing apparatus 40 based on the calculated positional deviation. The transfer pick 32c is moved to the temporary delivery position that is corrected based on the calculated positional deviation, and the sensor-equipped wafer Ws is loaded into the vacuum processing chamber 44 of the processing apparatus 40.

After the loading, the support pins 110 of the processing apparatus 40 are raised, and the sensor-equipped wafer Ws is delivered to the support pins 110. Subsequently, the transfer pick 32c is withdrawn from the vacuum processing chamber 44 and the support pins 110 are lowered, so that the sensor-equipped wafer Ws is delivered to and placed on the stage 100 inside the vacuum processing chamber 44 of the processing apparatus 40.

(B3: Inclination Detection)

Subsequently, under the control of the controller 51, the inclination of the sensor-equipped wafer Ws delivered to the stage 100 from the transfer pick 32c at the temporary delivery position is detected by the inclination sensor 211. Specifically, the controller 51 transmits a command to the controller of the sensor unit 210 of the sensor-equipped wafer Ws to measure the inclination. Upon receiving the command, the controller of the sensor unit 210 acquires the detection results of the inclination sensor 211 and transmits the same to the controller 51. The controller 51 receives the detection results of the inclination sensor 211 via the communication part 52 and stores the same in the storage part 53.

(B4: Picking Up Wafer from Stage 100 and Withdrawing Transfer Pick from Processing Apparatus 40)

Subsequently, under the control of the controller 51, the sensor-equipped wafer Ws on the stage 100 of the processing apparatus 40 is picked up by the transfer pick 32c, and the transfer pick 32c is withdrawn from the processing apparatus 40. Specifically, for example, first, the support pins 110 of the processing apparatus 40 are raised, and the sensor-equipped wafer Ws is delivered to the support pins 110. Thereafter, the transfer pick 32c is moved to, for example, the above-described corrected temporary delivery position, the support pins 110 are lowered, and the sensor-equipped wafer Ws is delivered to the transfer pick 32c. Subsequently, the transfer pick 32c is withdrawn from the vacuum processing chamber 44 and the support pins 110 are lowered.

In the correction method according to the present embodiment, steps B2 to B4 described above are performed for each of the plurality of different temporary delivery positions with respect to the X-axis direction in the coordinate system of the delivery position. For example, first, steps B2 to B4 described above are performed using a currently-set delivery position as an initial position of the temporary delivery position.

As a result, when the magnitude of the inclination around the Y axis detected in step B3 exceeds the threshold value (that is, in the case of FIG. 6), when the inclination has a positive value, the controller 51 decreases the X coordinate of the temporary delivery position stepwise (e.g., by 0.1 mm or 0.25 mm at each step) from the initial position such that the inclination is decreased. In addition, when the inclination has a negative value, the controller 51 increases the X coordinate of the temporary delivery position stepwise (e.g., by 0.1 mm or 0.25 mm at each step) from the initial position such that the inclination is increased.

As described above, the controller 51 performs a control to execute steps B2 to B4 for each temporary delivery position while changing the temporary delivery position stepwise.

In addition, the stepwise change of the temporary delivery position and the execution of steps B2 to B4 at each temporary delivery position are performed until the magnitude of the inclination around the Y axis exceeds the threshold value again after becoming equal to or less than the threshold value.

Meanwhile, when the magnitude of the inclination around the Y axis detected in step B3 is equal to or less than the threshold value (that is, in the case of FIG. 5) as a result of performing steps B2 to B4 for the initial position of the temporary delivery position, the controller 51 increases the X coordinate of the temporary delivery position stepwise (e.g., by 0.1 mm or 0.25 mm at each step) from the initial position such that the inclination is increased. In addition, the controller 51 performs a control to execute steps B2 to B4 for each temporary delivery position.

The stepwise change of the temporary delivery and the execution of steps B2 to B4 at each temporary delivery position are performed until the magnitude of the inclination around the Y axis exceeds the threshold value.

Thereafter, the controller 51 decreases the X coordinate of the temporary delivery position stepwise (e.g., by 0.1 mm or 0.25 mm at each step) from the initial position such that the inclination is decreased. In addition, the controller 51 performs a control to execute steps B2 to B4 for each temporary delivery position.

The stepwise change of the temporary delivery and the execution of steps B2 to B4 at each temporary delivery position are performed until the magnitude of the inclination around the Y axis exceeds the threshold value.

In the correction method according to the present embodiment, steps B2 to B4 are performed for each of the plurality of different temporary delivery positions with respect to the Y-axis direction in the coordinate system of the delivery position, similarly as in the X-axis direction.

When changing the temporary delivery position stepwise as described above, the controller 51 may acquire a range that may be a boundary between a position at which the magnitude of the inclination of the sensor-equipped wafer Ws is equal to or less than the threshold value and a position at which the magnitude of the inclination exceeds the threshold value by once changing the temporary delivery position stepwise with a large width (e.g., by 0.5 mm at each step) and executing steps B2 to B4 at each temporary delivery position. Then, the controller 51 may change the temporary delivery position stepwise with a small width within the range that may be the boundary, and may execute steps B2 to B4 at each temporary delivery position. In this way, it is possible to specify quickly and accurately the boundary between the temporary delivery position at which the magnitude of the inclination of the sensor-equipped wafer Ws is equal to or less than the threshold value and the temporary delivery position at which the magnitude exceeds the threshold value.

(B5: Correction of Delivery Position)

After steps B2 to B4 are performed for the plurality of temporary delivery positions in both the X-axis direction and the Y-axis direction as described above, the controller 51 corrects the delivery position relating to the processing apparatus 40 based on the detection results in step B3 for each temporary delivery position. Specifically, the controller 51 specifies the range of the X coordinate and the Y coordinate of the temporary delivery position at which the magnitude of the inclination of the sensor-equipped wafer Ws is equal to or less than the threshold value based on the detection results. Then, the controller 51 determines the center of the range as a corrected delivery position relating to the processing apparatus 40. For example, when the X coordinate of the temporary delivery position is in the range of 1x to 2x and the magnitude of the angle around the Y axis is equal to or less than the threshold value, and when the Y coordinate of the temporary delivery position is in the range of y1 to y2 and the magnitude of the angle around the X axis is equal to or less than the threshold value, the controller 51 determines a position expressed by $((x1+x2)/2, (y1+y2)/2)$ as the corrected delivery position and stores the same in the storage part 53.

(B6: Unloading of Sensor-Equipped Wafer Ws from Vacuum Transfer Apparatus 30)

Thereafter, the sensor-equipped wafer Ws is unloaded from the vacuum transfer apparatus 30 and is returned to the carrier C in a procedure opposite to step B1 described above. However, in the course of returning the sensor-equipped wafer Ws to the carrier C, the loading/unloading of the sensor-equipped wafer Ws into/from the aligner 24 and the adjustment of the orientation of the sensor-equipped wafer W in the aligner 24 are omitted.

By twice repeating a series of operations in which step B5 is performed after steps B2 to B4 are performed for the plurality of temporary delivery positions, the controller 51 may determine whether or not a deviation between a corrected delivery position determined in the first round and a corrected delivery position determined in the second round exceeds a permissible value.

As a result, when it is determined that the deviation is equal to or less than the permissible value, the controller 51 determines, for example, the first round of corrected delivery position or the second round of corrected delivery position as the corrected delivery position.

On the other hand, when it is determined that the deviation exceeds the permissible value, the controller 51 may execute the above series of operations again. The series of operations may be repeatedly executed until the corrected delivery position value becomes equal to or less than the permissible value during the two consecutive series of operations.

As described above, the method of correcting the delivery position relating to the processing apparatus 40 according to the present embodiment includes a placement operation of moving the sensor-equipped wafer Ws held by the transfer pick 32c to the temporary delivery position and delivering the sensor-equipped wafer Ws from the transfer pick 32c to the stage 100 to be placed on the stage 100. The correction method according to this embodiment includes an inclination detection operation of detecting the inclination of the sensor-equipped wafer Ws delivered to the stage 100 using the inclination sensor 211. Further, the correction method according to this embodiment performs the placement operation and the inclination detection operation described above for the plurality of different temporary delivery positions. In addition, the plurality of temporary delivery positions include a position at which a portion of the sensor-equipped wafer Ws is boarded on the stepped portion D when the sensor-equipped wafer Ws is delivered to the stage 100 from the transfer pick 32c at the respective temporary delivery position. Furthermore, the correction method according to this embodiment includes an operation of correcting the delivery position based on the detection results in the inclination detection operation.

In the correction method according to this embodiment, it is not necessary to expose the vacuum processing chamber 44 of the processing apparatus 40 to the atmosphere at the time of correction. This makes it possible to correct the delivery position in a short period of time.

In addition, the correction method according to this embodiment may be applied regardless of the height of the stepped portion D. In particular, the height of the stepped portion D may change as a result of repeating a process such as an etching process. The correction method according to this embodiment may be applied to both before and after such a change in height.

With the correction method according to this embodiment, the delivery position can be automatically corrected, rather than being manually corrected by an operator. Unlike the correction method according to this embodiment, in a correction method involving work by the operator, an appropriately corrected delivery position may not be obtained depending on operator's skill. However, the correction method according to this embodiment does not cause such a problem.

In the correction method according to this embodiment, when the transfer pick 32c holding the sensor-equipped wafer Ws is moved to the temporary delivery position as in step B2 described above, the positional deviation of the sensor-equipped wafer Ws on the transfer pick 32c is detected. In step B2 described above, the transfer pick 32c is moved to the temporary transfer position corrected based on the detection results, and the sensor-equipped wafer Ws is delivered from the transfer pick 32c to the stage 100. Therefore, the position of the sensor-equipped wafer Ws when delivering from the transfer pick 32c to the stage 100 may be used as a desired position regardless of the positional deviation of the sensor-equipped wafer Ws on the transfer pick 32c.

However, in the case in which the sensor-equipped wafer Ws is placed on the stage 100 such that a portion of the sensor-equipped wafer Ws is boarded on the stepped portion D in step B2 described above, when the sensor-equipped wafer Ws is picked up by the transfer pick 32c via the support pins 110 in step B4 described above, the sensor-equipped wafer Ws may be deviated with respect to the transfer pick 32c. Even if there is such a deviation, by correcting the temporary delivery position based on the detection results of the positional deviation of the sensor-equipped wafer Ws on the transfer pick 32c as described above when the transfer pick 32c is moved to a next temporary delivery position, it is possible to set the position of the sensor-equipped wafer Ws as a desired position when delivering the sensor-equipped wafer Ws from the transfer pick 32c at the next temporary delivery position to the stage 100.

<Other Examples of Correction Method>

In the above-described examples, the placement operation and the inclination detection operation are performed for the plurality of different temporary delivery positions. However, in a case in which the height of the stepped portion D, which is stored in the storage part 53 in advance, can be acquired from the storage part 53, the placement operation and the inclination detection operation may be performed only for one temporary delivery position. In this case, as the one temporary delivery position, a position at which a portion of the sensor-equipped wafer Ws is boarded on the stepped portion D when the sensor-equipped wafer Ws is delivered to the stage 100 from the transfer pick 32c at the respective temporary delivery position may be selected. Then, the controller 51 corrects the delivery position based on the detection results by the inclination detection operation for the one temporary delivery position. Specifically, the controller 51 estimates the deviation of the center of the censor-equipped wafer Ws from the center of the placement surface 100a (hereinafter, referred to as a "center deviation") based on the height of the stepped portion D and the inclination of the sensor-equipped wafer Ws a portion of which is boarded on the stepped portion D. Based on the estimated center deviation and the temporary delivery position, the controller 51 determines a corrected delivery position. More specifically, the controller 51 performs the placement operation and the inclination detection operation only for one temporary delivery and estimates the center deviation based on the detection result in the inclination detection operation to determine the corrected delivery position for each of the X-axis direction and the Y-axis direction in the coordinate system of the delivery position. For example, when the estimated center deviations in the X-axis direction and the Y-axis direction are assumed to be $\Delta x$ and $\Delta y$, respectively, and the coordinates of the temporary delivery position are assumed to be $(x_v, y_v)$, the controller 51 sets the coordinates of the corrected delivery position to $(x_v\text{-}\Delta x, y_v\text{-}\Delta y)$.

Even in the case of this correction method, a series of operations in which a correction operation is performed after performing the placement operation and the inclination detection operation for one temporary delivery position is repeated twice, and when a deviation between a first round of corrected delivery position and a second round of corrected delivery position exceeds a permissible value, the series of operations may be performed again.

Modification

The corrected delivery positions determined in the correction operation may be stored in the storage part 53. As a result, for example, when an abnormality occurs in the result of the process such as an etching process performed by the processing apparatus 40, based on information on the accumulated corrected delivery positions, it is possible to determine whether or not the correction of the delivery position, that is, teaching, is appropriately performed.

In the above-described examples, the sensor-equipped wafer Ws has been assumed to be loaded into the vacuum transfer apparatus 30 from the carrier C placed on the carrier stage 20. Instead of this, the sensor-equipped wafer Ws may be placed on a support part (not illustrated) by opening the lid of a load-lock apparatus 12 or 13, and may be loaded into the vacuum transfer apparatus 30 from the support part.

In the above-described examples, a sensor-equipped wafer Ws is accommodated in the carrier C. Instead of this, an accommodation module may be provided in the vacuum transfer apparatus 30 or the atmospheric transfer apparatus 21, and the sensor-equipped wafer Ws may be accommodated in the accommodation module.

According to the present disclosure, it is possible to correct a delivery position of a substrate from a substrate transfer apparatus to a processing apparatus that processes a substrate in a depressurized atmosphere in a short period of time.

It should be noted that the embodiments and modifications disclosed herein are exemplary in all respects and are not restrictive. The above-described embodiments may be omitted, replaced or modified in various forms without departing from the scope and spirit of the appended claims.

What is claimed is:

1. A method of correcting a delivery position of a substrate from a substrate transfer apparatus to a processing apparatus that processes the substrate in a depressurized atmosphere,
    wherein the substrate transfer apparatus includes a holder configured to hold the substrate and move the substrate to the delivery position in the processing apparatus, and the processing apparatus includes a stage to which the substrate held by the holder at the delivery position is delivered,
    wherein the stage includes a placement surface on which the substrate is placed and an annular stepped portion concentric with the placement surface, the annular stepped portion being provided to surround a peripheral edge of the placement surface and to protrude upward,
    wherein the method comprises:
        obtaining a relationship between coordinates of the delivery position and an inclination of the substrate, which is delivered from the holder at the delivery position and placed on the stage; and
        performing a correction operation of correcting the delivery position based on the relationship between the coordinates of the delivery position and the inclination of the substrate on the stage,
    wherein the obtaining the relationship includes performing:
        a placement operation of holding and moving, by the holder, a sensor-equipped substrate, which includes an inclination sensor provided on a substrate main body that imitates the substrate, to a temporary delivery position in the processing apparatus, and delivering the sensor-equipped substrate held by the holder at the temporary delivery position to the stage to place the sensor-equipped substrate on the stage; and
        an inclination detection operation of detecting, using the inclination sensor, an inclination of the sensor-equipped substrate on the stage,
    wherein the placement operation and the inclination detection operation are performed plural times while changing coordinates of the temporary delivery position stepwise, until a magnitude of the detected inclination of the sensor equipped substrate on the stage exceeds a threshold value, and subsequently the correction operation is performed,
    wherein the coordinates of the temporary delivery position include a position that causes a portion of the sensor-equipped substrate, which is delivered from the holder to the stage, to be boarded on the stepped portion,
    wherein the obtaining the relationship and the performing the correction operation are performed with respect to each of two directions orthogonal to each other in a horizontal plane, and
    wherein the correction operation includes:
        specifying a range of the coordinates of the temporary delivery position, which causes the magnitude of the detected inclination of the sensor-equipped substrate on the stage to be equal to or less than the threshold value; and
        setting, as a corrected delivery position, a center of the range of the coordinates of the temporary delivery position.

2. The method of claim 1, further comprising:
    performing a deviation detection operation of detecting a positional deviation of the sensor-equipped substrate on the holder, which holds the sensor-equipped substrate,
    wherein the placement operation includes holding and moving, by the holder, the sensor-equipped substrate to the temporary delivery position, which is corrected based on the detected positional deviation, and delivering the sensor-equipped substrate from the holder to the stage to place the sensor-equipped substrate on the stage.

3. The method of claim 2, wherein when a series of operations, in which the placement operation and the inclination detection operation are performed with respect to the one or more temporary delivery positions different from one another and then the correction operation is performed, is repeated twice, and when a deviation between a delivery position after a first correction operation and a delivery position after a second correction operation exceeds a permissible value, the series of operations is performed again.

4. The method of claim 1, wherein when a series of operations, in which the placement operation and the inclination detection operation are performed with respect to the one or more temporary delivery positions different from one another and then the correction operation is performed, is repeated twice, and when a deviation between a delivery position after a first correction operation and a delivery position after a second correction operation exceeds a permissible value, the series of operations is performed again.

5. A substrate transfer apparatus for transferring a substrate to a processing apparatus that processes the substrate in a depressurized atmosphere,
    wherein the processing apparatus includes a stage including a placement surface on which the substrate is placed and an annular stepped portion concentric with the placement surface, the annular stepped portion being provided to surround a peripheral edge of the placement surface and to protrude upward,
    wherein the substrate transfer apparatus comprises:
        a holder configured to hold the substrate and move the substrate to a delivery position in the processing apparatus;
        a drive mechanism configured to move the holder; and
        a controller,
    wherein the controller is configured to output a control signal to perform:
        obtaining a relationship between coordinates of the delivery position and an inclination of the substrate, which is delivered from the holder at the delivery position and placed on the stage; and
        performing a correction operation of correcting the delivery position based on the relationship between the coordinates of the delivery position and the inclination of the substrate on the stage, wherein the obtaining the relationship includes performing:

a placement operation of holding and moving, by the holder, a sensor-equipped substrate, which includes an inclination sensor provided on a substrate main body that imitates the substrate, to a temporary delivery position in the processing apparatus, and delivering the sensor-equipped substrate held by the holder at the temporary delivery position to the stage to place the sensor-equipped substrate on the stage; and an inclination detection operation of detecting, by the inclination sensor, an inclination of the sensor-equipped substrate on the stage, wherein the placement operation and the inclination detection operation are performed plural times while changing coordinates of the temporary delivery position stepwise, until a magnitude of the detected inclination of the sensor equipped substrate on the stage exceeds a threshold value, and subsequently the correction operation is performed, wherein the coordinates of the temporary delivery position include a position that causes a portion of the sensor-equipped substrate, which is delivered from the holder to the stage, to be boarded on the stepped portion, wherein the obtaining the relationship and the performing the correction operation are performed with respect to each of two directions orthogonal to each other in a horizontal plane, and wherein the correction operation includes:

specifying a range of the coordinates of the temporary delivery position, which causes the magnitude of the detected inclination of the sensor-equipped substrate on the stage to be equal to or less than the threshold value; and setting, as a corrected delivery position, a center of the range of the coordinates of the temporary delivery position.

* * * * *